US010586721B2

(12) United States Patent
Murata et al.

(10) Patent No.: US 10,586,721 B2
(45) Date of Patent: Mar. 10, 2020

(54) PURGE DEVICE, PURGE STOCKER, AND PURGE METHOD

(71) Applicant: MURATA MACHINERY, LTD., Kyoto-shi, Kyoto (JP)

(72) Inventors: Masanao Murata, Ise (JP); Takashi Yamaji, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 133 days.

(21) Appl. No.: 15/754,752

(22) PCT Filed: Jun. 20, 2016

(86) PCT No.: PCT/JP2016/068267
§ 371 (c)(1),
(2) Date: Feb. 23, 2018

(87) PCT Pub. No.: WO2017/033546
PCT Pub. Date: Mar. 2, 2017

(65) Prior Publication Data
US 2018/0247846 A1    Aug. 30, 2018

(30) Foreign Application Priority Data

Aug. 25, 2015 (JP) ................................ 2015-165521

(51) Int. Cl.
*H01L 21/673* (2006.01)
*H01L 21/677* (2006.01)

(52) U.S. Cl.
CPC .. *H01L 21/67389* (2013.01); *H01L 21/67393* (2013.01); *H01L 21/67769* (2013.01)

(58) Field of Classification Search
CPC ......... H01L 21/67389; H01L 21/67769; H01L 21/67393
See application file for complete search history.

(56) References Cited

U.S. PATENT DOCUMENTS

| 5,827,118 | A | * | 10/1998 | Johnson | .................. | F24F 3/161 |
| | | | | | | 454/187 |
| 6,044,874 | A | * | 4/2000 | Saga | .................. | H01L 21/67393 |
| | | | | | | 141/48 |
| 9,064,918 | B2 | | 6/2015 | Takahara et al. | | |
| 9,779,973 | B2 | * | 10/2017 | Murata | ............ | H01L 21/67017 |
| 2014/0000757 | A1 | | 1/2014 | Takahara et al. | | |

(Continued)

FOREIGN PATENT DOCUMENTS

| JP | 2004-349322 A | 12/2004 |
| JP | 2008-068888 A | 3/2008 |

(Continued)

OTHER PUBLICATIONS

Official Communication issued in corresponding European Patent Application No. 16838893.2, dated Apr. 2, 2019.

(Continued)

*Primary Examiner* — Umashankar Venkatesan
(74) *Attorney, Agent, or Firm* — Keating & Bennett, LLP

(57) ABSTRACT

A purge device capable of appropriately purging a container in accordance with a type of a container includes a type detector that detects a type of a container to be purged, and a purge controller that determines purge conditions for the container based on a detection result from the type detector.

9 Claims, 7 Drawing Sheets

(56) References Cited

U.S. PATENT DOCUMENTS

| | | | |
|---|---|---|---|
| 2014/0014225 A1 | 1/2014 | Takahara et al. | |
| 2014/0014229 A1* | 1/2014 | Takahara | B65B 5/00 |
| | | | 141/129 |
| 2015/0000785 A1* | 1/2015 | Shin | F17C 5/007 |
| | | | 141/4 |
| 2015/0003941 A1 | 1/2015 | Takahara et al. | |
| 2015/0202664 A1* | 7/2015 | Murata | H01L 21/67769 |
| | | | 134/25.5 |
| 2016/0225648 A1* | 8/2016 | Murata | H01L 21/67017 |
| 2016/0351427 A1* | 12/2016 | Murata | B08B 5/04 |
| 2017/0243776 A1* | 8/2017 | Murata | H01L 21/67379 |
| 2018/0229276 A1* | 8/2018 | Tsubaki | B08B 5/02 |
| 2018/0244470 A1* | 8/2018 | Murata | B65G 1/14 |

FOREIGN PATENT DOCUMENTS

| | | |
|---|---|---|
| JP | 2009-246154 A | 10/2009 |
| JP | 2010-182747 A | 8/2010 |

OTHER PUBLICATIONS

Official Communication issued in International Patent Application No. PCT/JP2016/068267, dated Feb. 27, 2018.
Official Communication issued in International Patent Application No. PCT/JP2016/068267, dated Aug. 16, 2016.

* cited by examiner

FIG. 3A
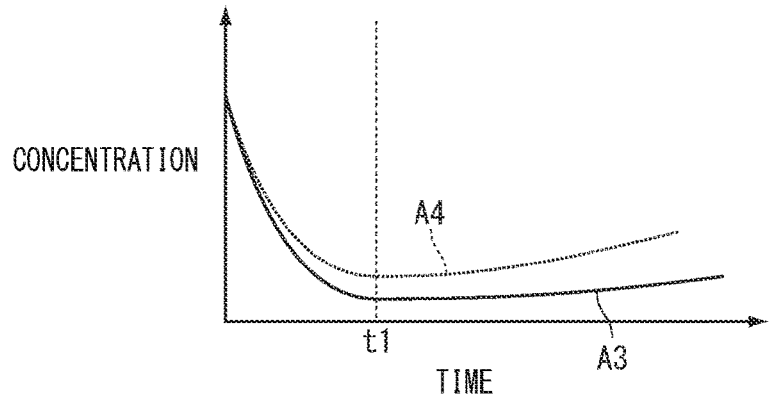
FIG. 3B
| TYPE OF CONTAINER | INITIAL PURGING FLOW RATE | INITIAL PURGING TIME | MAINTAINING PURGING FLOW RATE |
|---|---|---|---|
| A1 | QA1 | TA1 | QB1 |
| A2 | QA2 | TA2 | QB2 |
| A3 | QA3 | TA3 | QB3 |
| A4 | QA4 | TA4 | QB4 |
| ⋮ | ⋮ | ⋮ | ⋮ |
| An | QAn | TAn | QBn |
FIG. 3C
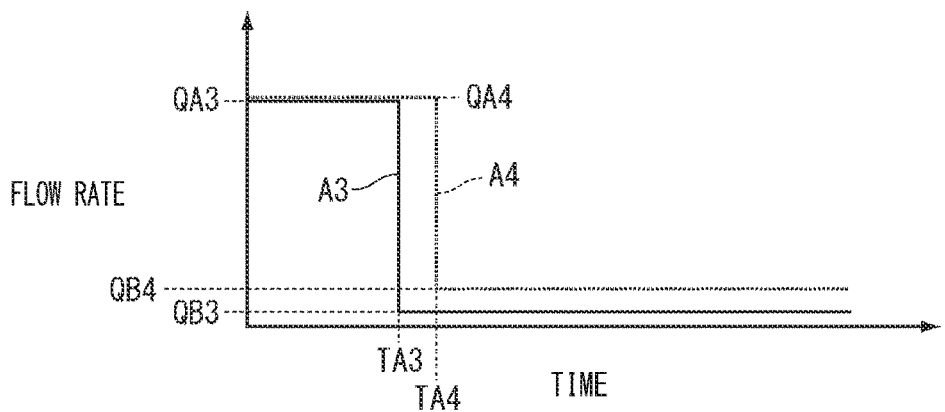

PURGE DEVICE, PURGE STOCKER, AND PURGE METHOD

BACKGROUND OF THE INVENTION

1. Field of the Invention

The present invention relates to a purge device, a purge stocker, and a purge method.

2. Description of the Related Art

A purge stocker stores therein containers. The containers are able to contain various kinds of articles such as wafers and reticles. Examples of the containers include FOUP, SMIF Pod, and reticle Pod. For storage of the containers, the purge stocker fills a purge gas such as clean dry air or nitrogen gas into the container by a purge device to suppress contamination or oxidation of contained matters (refer to Japanese Patent Application Publication No. 2010-182747, for example). The above-mentioned containers have been conventionally standardized, but the materials, the sealing structure, and the positions of purge gas introduction ports are not regulated and are different depending on the types of containers. For example, dedicated containers are used depending on the type of purge devices. In recent years, the interface between a container and a purge device (for example, the position of a supply port for purge gas) has been further standardized in part, and the number of cases where a purge device of one type is able to purge a plurality of types of containers has increased.

However, purge characteristics are different depending on the types of containers, and it may be difficult to appropriately purge the containers. For example, in the case where optimal gas flow rates are different among a plurality of types of containers, if the supply amount of the purge gas is adjusted based on a container having a small optimal flow rate, the purge gas is insufficient in a container having a large optimal flow rate, and the effect of purging is insufficient. If the supply amount of the purge gas is adjusted based on a container having a large optimal flow rate, the purge gas in a container having a small optimal flow rate is excessive, and the wasted amount of the purge gas increases. Furthermore, there is a disadvantage such as a fear of deterioration of sealing performance in the container or damage of a filter at an introduction port.

SUMMARY OF THE INVENTION

In view of the above-mentioned circumstances, preferred embodiments of the present invention provide purge devices, purge stockers, and purge methods capable of appropriately purging a container in accordance with the type of the container.

A purge device according to a preferred embodiment of the present invention includes a type detector that detects a type of a container to be purged; and a purge controller that determines purge conditions for the container based on a detection result from the type detector.

Furthermore, a purge device according to a preferred embodiment of the present invention may include a state detector that detects a purged state of the container, and the type detector may detect the type of the container based on a detection result from the state detector. Furthermore, the purge device may include a flow rate control device that controls a flow rate of a purge gas in a pipe connected to the container, the state detector may detect a pressure of the purge gas in the pipe as the purged state, and the type detector may detect the type of the container based on purge characteristics of the container acquired based on the pressure detected by the state detector. The type detector may discriminate the type of the container based on characteristic information in which the pressure and the type of the container are associated with each other and based on the detection result from the state detector. Furthermore, the type detector may discriminate the type of the container based on a detection result from a sensor that detects an identifier provided to the container and based on identifier information in which the identifier and the type of the container are associated with each other. Furthermore, a unique code allocated to the container may be used as the identifier. As the identifier, an info pad provided on a bottom surface of the container may be used. Furthermore, the purge device may include a flow rate control device that controls a flow rate of a purge gas supplied to the container, and the purge controller may determine purge conditions based on condition information in which the type of the container and the purge conditions are associated with each other, and control the flow rate control device based on the determined purge conditions. Furthermore, the purge conditions may include a flow rate and a supply time of a purge gas supplied to the container.

A purge stocker according to a preferred embodiment of the present invention includes the above-described purge device; and a shelf that holds a container purged by the purge device.

A purge method according to a preferred embodiment of the present invention includes detecting a type of a container to be purged; and determining purge conditions for the container based on a result of the detecting.

According to preferred embodiments of the present invention, purge conditions for a container to be purged are determined based on the result of detecting the type of the container, thus enabling the container to be purged under the purge conditions suited for the type of the container and enabling the container to be appropriately purged.

Furthermore, a purge device according to a preferred embodiment of the present invention that includes a state detector capable of detecting a purged state of the container and in which the type detector detects the type of the container based on a detection result from the state detector is able to detect the type of the container based on the actual purged state. Furthermore, a purge device according to a preferred embodiment of the present invention that includes a flow rate control device that controls a flow rate of a purge gas in a pipe connected to the container and in which the state detector detects a pressure of the purge gas in the pipe as the purged state and the type detector detects the type of the container based on purge characteristics of the container acquired based on the pressure detected by the state detector is able to detect the type of the container with high accuracy because, for example, a pressure loss at a gas introduction port is reflected to the pressure of the purge gas. Furthermore, a purge device according to a preferred embodiment of the present invention in which the type detector discriminates the type of the container based on characteristic information in which the pressure and the type of the container are associated with each other and based on a detection result from the state detector is able to discriminate the type of the container by collating the detection result of the pressure with the characteristic information, and is thus able to easily detect the type of the container with high accuracy. Furthermore, a purge device according to a preferred embodiment of the present invention in which the type detector discriminates the type of the container based on a detection result from a sensor that detects an identifier provided to the container and based on identifier information in which the identifier and the type of the container are associated with each other is able to discriminate the type of the container by collating the identifier detected by the sensor with the identifier information, and is thus able to easily detect the type of the container with high accuracy. Furthermore, a purge device according to a preferred embodiment of the present invention in which a unique code allocated to the container is used as the identifier is able to detect the type of the container by using a code used for management of the container, for example. Furthermore, a purge device according to a preferred embodiment of the present invention in which an info pad provided on a bottom surface of the container is used as the identifier is able to detect the type of the container by using a standard info pad provided to a container. Furthermore, a purge device according to a preferred embodiment of the present invention that includes a flow rate control device that controls a flow rate of a purge gas supplied to the container and in which the purge controller determines purge conditions based on condition information in which the type of the container and the purge conditions are associated with each other, and controls the flow rate control device based on the determined purge conditions is able to easily determine purge conditions matching with the type of the container because the purge conditions are determined by collating the type of the container with the condition information, and is able to control the state of purging in the container with high accuracy because the flow rate control device is controlled based on the determined purge conditions. Furthermore, a purge device according to a preferred embodiment of the present invention in which the purge conditions include a flow rate and a supply time of a purge gas supplied to the container is able to control the state of purging in the container with high accuracy because a time history of the supply amount of the purge gas is controllable.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A to 3C are explanatory diagrams of purge characteristics, condition information, and purge conditions.

DETAILED DESCRIPTION OF THE PREFERRED EMBODIMENTS

Preferred embodiments are described below with reference to the drawings. In each of the figures referred to below, an XYZ coordinate system is used to describe the directions in the figure. In the XYZ coordinate system, the vertical direction is a Z direction, and the horizontal directions are an X direction and a Y direction.

First Preferred Embodiment

Figure 1A:
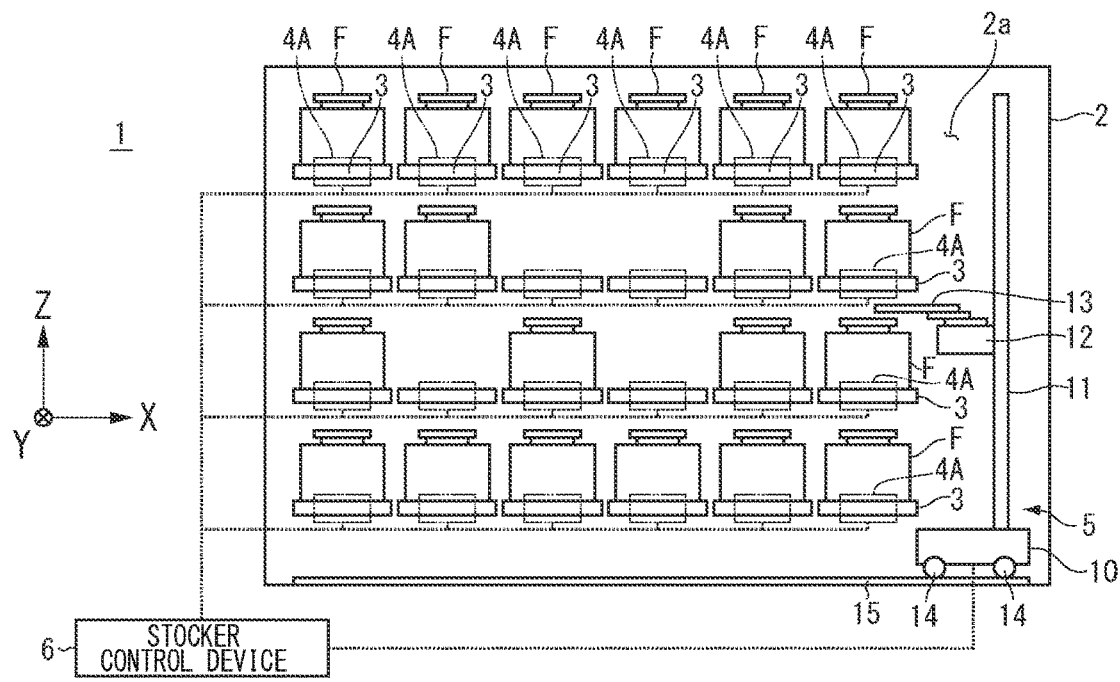
FIGS. 1A and 1B are diagrams illustrating a purge stocker and a purge device according to a first preferred embodiment of the present invention.
Figure 1B:
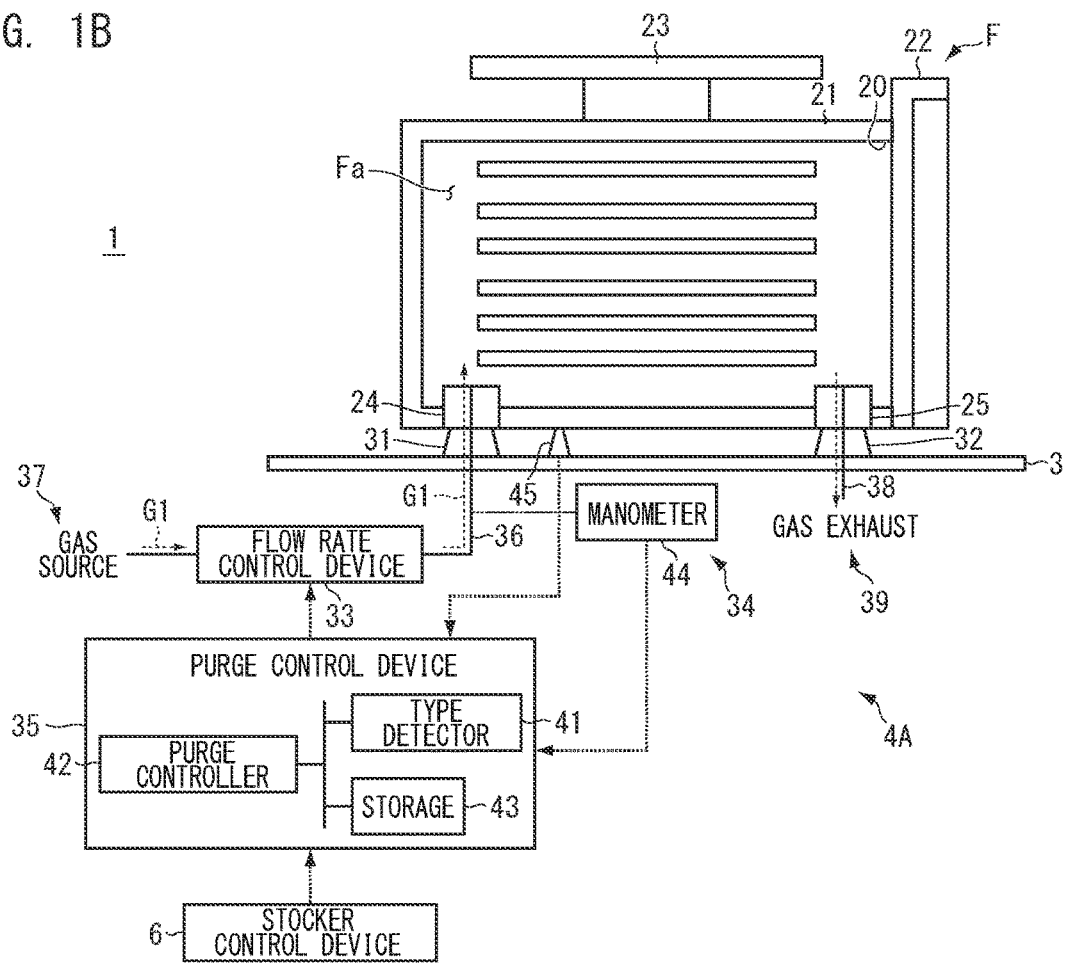

FIG. 1A is a diagram illustrating an example of a purge stocker 1 according to the present preferred embodiment. FIG. 1B is a diagram illustrating an example of a container F and a purge device 4A. The purge stocker 1 is, for example, an automatic warehouse that stores therein containers F for containing articles such as wafers and reticles used for manufacturing of semiconductor elements. Examples of the containers F include FOUP, SMIF Pod, and reticle Pod. Reticles may be used for a liquid immersion exposure device or may be used for an EUV exposure device, for example.

As illustrated in FIG. 1A, the purge stocker 1 includes a casing 2, a plurality of storage shelves 3, a plurality of purge devices 4A, a stacker crane (conveyance device) 5, and a stocker control device 6. The casing 2 includes an internal space 2a that is isolatable from the outside. The casing 2 includes a loading and unloading port (not shown) through which a container F is transferred between the outside of the casing 2 and the internal space 2a. The storage shelves 3, the purge devices 4A, and the stacker crane 5 are provided in the internal space 2a in the casing 2. The stocker control device 6 may be disposed inside or outside the casing 2. The stocker control device 6 controls the purge devices 4A and the stacker crane 5. Note that a control device that controls the purge device 4A and a control device that controls the stacker crane 5 may be separately provided.

The stacker crane 5 is able to convey the container F in each of the X direction, the Y direction, and the Z direction, and is, for example, able to convey the container F between a loading and unloading port and the storage shelf 3 and/or convey the container F from a storage shelf 3 to another storage shelf 3. The stacker crane 5 includes, for example, a traveling carriage 10, a support column 11, a support base 12, and a transfer device 13. The traveling carriage 10 includes a plurality of wheels 14, and moves in the horizontal direction (X direction) along a rail 15 provided on the bottom surface of the casing 2.

The support column 11 extends from the top surface of the traveling carriage 10 in the vertical direction (Z direction). The support base 12 is supported by the support column 11, and is slidable in the Z direction along the support column 11. The transfer device 13 includes, for example, an extendable arm and a mount including a top surface on which a container F is placeable. Note that, in the stacker crane 5, for example, the transfer device 13, which supports the bottom surface of the container F to convey the container F, may be replaced with a transfer device that grips a flange 23 (see FIG. 1B) on top of the container F and conveys the container F while suspending the container F or with a transfer device that conveys the container F while gripping a side surface of the container F. Furthermore, although FIGS. 1A and 1B illustrate one stacker crane 5, the number of the stacker cranes 5 provided in the casing 2 may be two or more.

The storage shelves 3 are arranged in a plurality of stages in the height direction (Z direction) and arranged in a plurality of rows in the horizontal direction (X direction). The storage shelves 3 are each able to have a container F placed thereon. The storage shelves 3 are each a shelf that is able to hold a container F purged by the purge device 4A.

Note that some storage shelves 3 may have no containers F placed thereon depending on the storage conditions of containers F.

FIG. 1B illustrates a FOUP as an example of the container F. The container F includes a box-shaped main body 21 having an opening 20 in the front surface and a lid 22 that closes the opening 20. An article such as a wafer is contained in an interior Fa (internal space, containing space) of the container F through the opening 20. The flange 23 is provided on top of the main body 21. The main body 21 includes, on its bottom surface side, recesses (not shown) that perform positioning. Examples of the recesses include grooves that radially extend from the center of the bottom surface of the main body 21. Positioning pins (not shown) provided to a mounting table of the transfer device 13 are to be fitted into the recesses such that the container F is positioned with respect to the mounting table of the transfer device 13 when the container F is conveyed.

The storage shelf 3 includes a cutout (not shown) that allows the mounting table of the transfer device 13 to pass therethrough in the vertical direction. The transfer device 13 causes the mounting table to move inward from above the storage shelf 3 through the cutout, thus transferring a container F onto the top surface of the storage shelf 3. Positioning pins (not shown) are provided on the top surface of the storage shelf 3. The pins on the top surface of the storage shelf 3 are to be fitted into the recesses on the bottom surface side of the container F such that the container F is positioned with respect to the storage shelf 3 when the container F is placed on the storage shelf 3. The main body 21 of the container F includes a gas introduction port 24 and a gas exhaust port 25 on the bottom surface side.

For example, an introduction port, a filter, and a check valve are provided in the gas introduction port 24. The introduction port communicates with the interior Fa in the main body 21 and the outside. The inside of the introduction port is a flow path for a purge gas G1 supplied to the interior Fa in the container F, and the filter is provided in the flow path. The filter is, for example, a particle filter, and removes dust contained in a gas passing through the introduction port. The check valve in the gas introduction port 24 prevents a gas from flowing out to the outside from the interior Fa in the container F through the introduction port. For example, an exhaust port, a check valve, and a filter are provided in the gas exhaust port 25. The exhaust port communicates with the interior Fa in the main body 21 and the outside. The check valve in the gas exhaust port 25 prevents a gas from flowing into the interior Fa from the outside of the container F through the exhaust port. The filter is, for example, a particle filter, and removes dust contained in a gas passing through the exhaust port. In the gas passing through the exhaust port, the ratio of an atmosphere gas in the interior Fa in the container F before purging is high at the timing immediately after the start of purging, and the ratio of the purge gas G1 becomes higher as time elapses from the start of purging.

The purge device 4A includes a purge nozzle 31, an exhaust nozzle 32, a flow rate control device 33, a state detector 34, and a purge control device 35. The purge nozzle 31 and the exhaust nozzle 32 are provided on the top surface of the storage shelf 3. The purge nozzle 31 and the exhaust nozzle 32 are arranged so as to be connected to the introduction port and the exhaust port, respectively, when the container F is placed on the storage shelf 3. When the container F is placed on the storage shelf 3, the introduction port in the container F is connected to a pipe 36 through the purge nozzle 31, and is further connected to a gas source 37 through the flow rate control device 33. The exhaust nozzle 32 is connected to an exhaust path (gas exhaust 39) for the purge gas through a pipe 38.

The gas source 37 supplies a purge gas G1. The type of the purge gas G1 is selected depending on matters contained in the container F. For example, a gas that suppresses oxidation and molecular contamination of contained matters or a gas for reducing moisture inside the container F is used. For example, when a contained matter is a silicon wafer, an inactive gas such as nitrogen gas is used as the purge gas G1. When the nitrogen gas is supplied to the interior Fa in the container F, an atmosphere gas containing oxygen is discharged (removed) to the outside from inside the container F, and the silicon wafer is significantly reduced or prevented from being oxidized. Furthermore, when a contained matter is a reticle, a dry gas such as clean dry air (CDA) is used as the purge gas G1. When the clean dry air is supplied to the interior Fa in the container F, an atmosphere gas containing moisture is discharged (removed) to the outside from inside the container F, and moisture is significantly reduced or prevented from adhering to the reticle. The gas source 37 may be a part of the purge stocker 1, or may be a device outside the purge stocker 1. For example, the gas source 37 may be a facility in a factory where the purge stocker 1 is provided.

For purging the container F, the purge gas G1 from the gas source 37 is supplied via the flow rate control device 33 and the pipe 36 to the interior Fa through the introduction port in the container F, and is filled in the interior Fa in the container F. Furthermore, the gas in the interior Fa is discharged to the outside of the container F through the exhaust port, and is discharged to the outside by the gas exhaust 39 through the pipe 38. Note that the gas exhaust 39 may be provided with a device that sucks a gas by using a pump. The container F is not necessarily required to have the gas exhaust port 25, and in this case, the purge device 4A is not necessarily required to have the exhaust nozzle 32. For example, when the pressure in the interior Fa in the container F becomes equal to or larger than a threshold, a gas in the interior Fa in the container F leaks to the outside through a gap between the opening 20 and the lid 22, and hence even when the gas exhaust port 25 is not provided, the gas in the interior Fa in the container F is able to be discharged to the outside.

The flow rate control device 33 controls the flow rate of the purge gas G1 in the pipe 36 connected to the container F (flow path between the introduction port in the container F and the gas source 37). Examples of the flow rate control device 33 include a mass flow controller. The flow rate control device 33 has a flow path therein through which the purge gas G1 flows. For example, a flowmeter using a self-heat generating resistor and a flow rate control valve such as an electromagnetic valve may be provided in the flow path inside the flow rate control device 33. The flow rate control device 33 performs feedback control of the electromagnetic valve based on the measurement result of the flowmeter, and controls the flow rate of the purge gas G1 inside the flow rate control device 33 to approach a target value. By controlling the flow rate of the purge gas in the pipe 36 by the flow rate control device 33, the flow rate of the purge gas G1 supplied from the gas source 37 to the purge nozzle 31 is controlled. The flow rate control device 33 is communicably connected to the purge control device 35, and controls the flow rate of the purge gas G1 based on a control signal supplied from the purge control device 35.

The purge device 4A is able to change a container F to be purged, and repeatedly purge a plurality of containers F. For example, in the case where the purge device 4A is provided for each storage shelf 3, after a container F is carried out from the storage shelf 3, another container F is carried in the storage shelf 3, and the purge device 4A is able to purge the container F. Furthermore, for example, in the case where the purge device 4A is provided to a loading and unloading port, the purge device 4A is able to sequentially purge containers F carried to the loading and unloading port. A container F to be purged by the purge device 4A only needs to be a container F in which the planar position of an interface such as a gas introduction port 24 matches with the purge device 4A, and a plurality of types of containers F having different purge characteristics (described later) may be used. For example, the types of containers F may be different depending on contained matters even when manufactured by the same manufacturer, and may be different depending on difference of manufacturers. Containers F of different types may have different purge characteristics. In the first preferred embodiment, the purge device 4A purges the container F under purge conditions suited for the type of the container F.

The purge characteristics are information indicating the relation between purge conditions and a purged state, that is, information indicating response to purge conditions (characteristics of container F related to purging). Examples of the purge conditions include the flow rate of purge gas, supply time, and the total supply amount. When the flow rate changes with time, a time history of the flow rate is a purge condition, and the total supply amount in this case is the time integral of the flow rate. Examples of the purged state include the supply pressure, the amount or the ratio of purge gas inside the container F, the pressure inside the container F, and the concentration of a substance to be removed by purging (hereinafter referred to as "substance to be removed").

For example, the purge characteristics depend on factors of the container F included in the following items (A), (B), and (C). The items (A) include the internal volume, the internal shape, the number of gas introduction ports, the presence/absence of gas exhaust ports, the number of gas exhaust ports, and the airtight structure of the container F (for example, sealing structure between a main body 21 and a lid 22). The items (B) include the area (flow path area, inner diameter) of the gas introduction port, the area (flow path area, inner diameter) of the gas exhaust port, pressure loss in a particle filter, and the area of the particle filter. The items (C) include the material of the interior (for example, surface of inner wall) of the container F. For example, the above-mentioned items (A) and (C) influence a time history of the concentration of the substance to be removed in the container F. Examples of the substance to be removed include oxygen and moisture. In containers F in which the above-mentioned items (A) and (C) are different, for example, the manner of drop in the concentration of the substance to be removed when a purge gas is supplied at a constant flow rate and the degree of rise in the concentration of the substance to be removed after the supply of the purge gas is stopped are different. The above-mentioned items (B) influence the supply pressure of the purge gas, for example. Here, when at least one of the above-mentioned items (A) to (C) is different, the type of the container F is different.

A configuration that determines purge conditions suited for the type of the container F is described below. The purge control device 35 includes a type detector 41, a purge controller 42, and a storage 43. The type detector 41 detects the type of a container F to be purged. In the first preferred embodiment, the purge device 4A includes a state detector 34 that detects a purged state of the container F, and the type detector 41 detects the type of the container F based on the detection result from the state detector 34. The state detector 34 includes a manometer 44, and detects (measures) the pressure of a purge gas G1 in the pipe 36 as the purged state. The manometer 44 is provided in a flow path for the purge gas G1 between the flow rate control device 33 and the purge nozzle 31. The manometer 44 measures the pressure of the purge gas G1 obtained when the purge gas G1 is supplied to the purge nozzle 31 (hereinafter referred to as "supply pressure"). In the state in which the purge nozzle 31 is connected to an introduction port in the gas introduction port 24 in the container F, the supply pressure of the purge gas G1 is influenced by a pressure loss in the gas introduction port 24. Thus, the supply pressure of the purge gas G1 has a value corresponding to the structure of the gas introduction port 24, that is, a value corresponding to the type of the container F, which enables the detection result from the manometer 44 to be used for the detection of the type of the container F. For example, the type detector 41 discriminates (detects, specifies, determines) the type of the container F based on characteristic information in which the pressure (supply pressure) and the type of the container F are associated with each other and based on the detection result from the state detector 34 (manometer 44).

Figures 2A, 2B:
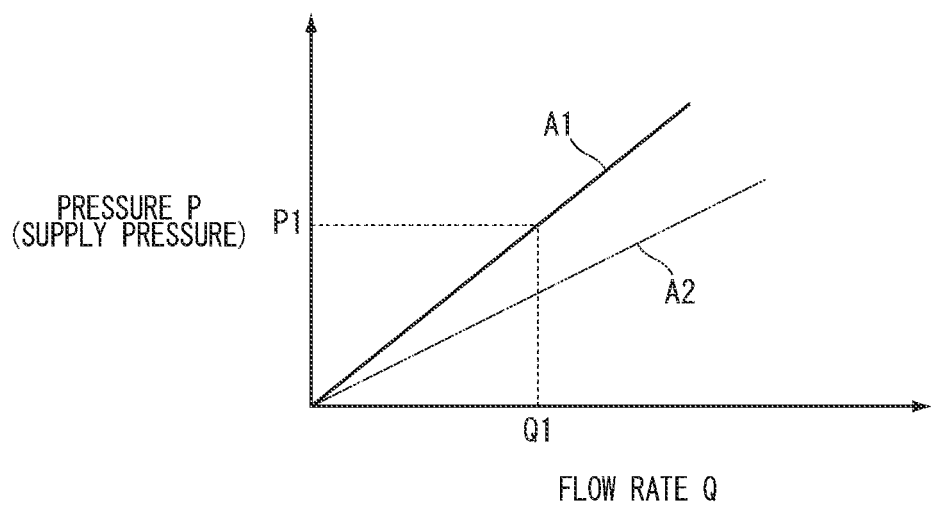
FIGS. 2A and 2B are explanatory diagrams of purge characteristics and characteristic information.

FIGS. 2A and 2B include explanatory diagrams of purge characteristics and characteristic information, FIG. 2A illustrating a graph of the supply pressure with respect to the flow rate of the purge gas, and FIG. 2B illustrating a conceptual diagram of characteristic information D1. Symbols A1 and A2 in FIGS. 2A and 2B denote the types of containers F. In the container F of the type A1, a pressure loss in the gas introduction port 24 is larger than in the container F of the type A2. For example, the supply pressure necessary for setting the flow rate to Q1 is higher in the container F of the type A1 than in the container F of the type A2. In FIG. 2B, the characteristic information D1 is represented in the form of table data. In the characteristic information D1, the first column indicates the range of the ratio between the supply pressure and the flow rate, and the second column indicates the type of the container F corresponding to the first column. For example, the first row in the characteristic information D1 indicates that when P/Q falls within the range (k1$a$ or more and k1$b$ or less) in the data cell in the first column, the type of the container F is "A1" in the data cell in the second column. Similarly, the second and subsequent rows indicate that when the ratio between the supply pressure and the flow rate falls within a predetermined range in data cells in the first column, the type of the container F is a type in a data cell in the second column. Such characteristics for each type of containers F may be investigated in advance by tests, or may be acquired from a nominal value (for example, catalogue value). For example, the characteristic information D1 is creatable by registering characteristics for each type of containers F in table data.

Returning to the description with reference to FIGS. 1A and 1B, the type detector 41 acquires the detection result (supply pressure P) of the manometer 44. Furthermore, for example, the type detector 41 acquires a target value of the flow rate supplied to the flow rate control device 33 as a flow rate Q. The type detector 41 calculates the ratio between the acquired P and Q, and collates the calculated ratio with characteristic information D1 (see FIG. 2B) to discriminate the type of the container F. The characteristic information D1 is stored in the storage 43. The type detector 41 acquires the characteristic information D1 from the storage 43, and collates the calculated ratio between P and Q with the characteristic information D1 to discriminate the type of the container F. Note that the characteristic information D1 is not necessarily required to be stored in the storage 43, and, for example, the type detector 41 may acquire the characteristic information D1 from an external database via a communication line such as the Internet. Furthermore, the items in the characteristic information D1 illustrated in FIG. 2B are an example, and other parameters may be used.

The purge controller 42 determines purge conditions for the container F based on the detection result from the type detector 41. The purge conditions include the flow rate and the supply time of the purge gas G1 supplied to the container F. The purge controller 42 determines the purge conditions based on condition information in which the type of the container F is associated with purge conditions. The purge controller 42 controls the flow rate control device 33 based on the determined purge conditions.

FIGS. 3A to 3C include explanatory diagrams of purge characteristics, condition information, and purge conditions. Symbols A3 and A4 in FIGS. 3A to 3C represent the types of containers F. FIG. 3A conceptually illustrates a time history of the concentration of a substance to be removed. In FIG. 3A, the horizontal axis represents a time from the start of supply of purge gas, and the vertical axis represents the concentration of a substance to be removed in the container F. It is assumed that the supply of purge gas is stopped at a time point when a time t1 has elapsed since the supply of the purge gas was started. The flow rate of the purge gas is the same for the types A3 and A4. In a period until the time t1 elapses from the start of the supply of the purge gas, the concentration of a substance to be removed in the container F of the type A3 more remarkably decreases than that in the container F of the type A4. For example, when the volume of the container F of the type A3 is smaller than that of the container F of the type A4, the proportion of the purge gas to the volume in the container F of the type A3 more remarkably increases than that of the container F of the type A4, and hence such purge characteristics are obtained. Furthermore, in a period after the time t1 has elapsed from the start of the supply of the purge gas, in the container F of the type A3, the concentration of the substance to be removed gradually increases with time, and in the container F of the type A4, the increase (inclination) of the concentration of the substance to be removed is steeper than in the container F of the type A3. Such a difference in purge characteristics occurs, for example, when the material in the container F of the type A3 is different from that in the container F of the type A4. For example, in the case where a substance to be removed is moisture, when the adsorption amount and the absorption amount of moisture at the inner wall are larger in the container F of the type A4 than in the container F of the type A3, the amount of moisture discharged from the inner wall after the supply of the purge gas is stopped is large, and the increase (inclination) of the concentration of the substance to be removed is steep.

In FIG. 3B, the condition information D2 is represented in the form of table data. Here, it is assumed that a purge gas is supplied at a predetermined flow rate to perform initial purging until the concentration of a substance to be removed becomes a predetermined value or less, and subsequently, the flow rate of the purge gas is changed to perform maintaining purging so as to maintain the concentration of the substance to be removed to the predetermined value or less. In the condition information D2, the first column is the type (A1, A2, . . . , An) of containers F, the second row is the flow rate (QA1, QA2, . . . , QAn) for initial purging, the third column is a time (TA1, TA2, . . . , TAn) for initial purging, and the fourth column is the flow rate (QB1, QB2, . . . , QBn) for maintaining purging. For example, the third row in the condition information D2 indicates that when the type of a container F to be purged is A3, the flow rate of the purge gas for initial purging is set to QA3, the time (duration) for initial purging is set to TA3, and the flow rate of the purge gas for maintaining purging is set to QB3. Similarly, the fourth row indicates that when the type of a container F to be purged is A4, the flow rate for initial purging is set to QA4, the time for initial purging is set to TA4, and the flow rate for maintaining purging is set to QB4.

For example, when the type of the container F detected by the type detector 41 is A3, the purge controller 42 (see FIGS. 1A and 1B) controls the flow rate control device 33 in accordance with the purge conditions indicated in the third row in the condition information D2. For example, when the type of the container F is A3 (see FIGS. 3A to 3C), the purge controller 42 controls the flow rate control device 33 to designate QA3 as a target value of the flow rate of the purge gas, and starts initial purging. Furthermore, at the timing at which the elapsed time from the start of initial purging becomes TA3, the purge controller 42 controls the flow rate control device 33 to designate QB3 as a target value of the flow rate of the purge gas, and starts maintaining purging. Furthermore, when the type of the container F is A4 (see FIG. 3), the purge controller 42 controls the flow rate control device 33 to designate QA4 as a target value of the flow rate of the purge gas, and starts initial purging. Here, QA4 has the value substantially the same as QA3, but may have a value different from QA3. Furthermore, at the timing at which the elapsed time from the start of initial purging becomes TA4, the purge controller 42 controls the flow rate control device 33 to designate QB4 as a target value of the flow rate of the purge gas, and starts maintaining purging. In FIG. 3A, compared with the container F of the type A3, the container F of the type A4 has a small inclination by which the concentration of the substance to be removed decreases, and a time TA4 for initial purging for the container F of the type A4 is set to a value larger than that of a time TA3 for initial purging for the container F of the type A3. Furthermore, in FIG. 3A, compared with the container F of the type A3, the container F of the type A4 has a large inclination by which the concentration of the substance to be removed increases after the supply of the purge gas is stopped, and a flow rate QB4 for maintaining purging for the container F of the type A4 is set to a value larger than that of a flow rate QB3 for maintaining purging for the container F of the type A3.

Returning to the description with reference to FIGS. 1A and 1B, the purge controller 42 acquires the type of the container F detected by the type detector 41, and acquires condition information D2 (see FIG. 3B). The condition information D2 is stored in the storage 43. The purge controller 42 acquires the condition information D2 from the storage 43, and collates the type of the container F with the condition information D2 to determine purge conditions. Note that the condition information D2 is not necessarily required to be stored in the storage 43, and, for example, the type detector 41 may acquire the condition information D2 from an external database via a communication line such as the Internet. Furthermore, the items in the condition information illustrated in FIG. 3B are examples, and may include conditions corresponding to the supply pressure. For example, depending on the type of the container F, an upper limit value of the flow rate taking the supply pressure permitted for the gas introduction port 24 into consideration may be determined in the condition information.

The stocker control device 6 controls the purge device 4A by supplying a control instruction to the purge control device 35. The stocker control device 6 controls the stacker crane 5 to convey a container F to be purged to the purge device 4A, and controls the purge device 4A to purge the container F. In the storage shelf 3, a presence/absence sensor 45 that detects that the container F is placed is provided. The purge control device starts purging based on the detection result from the presence/absence sensor 45. The presence/absence sensor 45 is a contact sensor such as a button sensor, and when pressed down by the bottom surface of the container F, detects that the container F is placed on the storage shelf 3. The presence/absence sensor 45 is communicably connected to the purge control device 35, and supplies the detection result to the purge control device 35.

An input interface and a display are connected to the stocker control device 6. Examples of the input interface include an operation panel, a touch panel, a keyboard, a mouse, and a trackball. The input interface detects an input from an operator, and supplies input information to the stocker control device. Furthermore, examples of the above-mentioned display include a liquid crystal display. The display displays images supplied from the stocker control device 6. For example, the stocker control device 6 displays images indicating the operating status, various kinds of settings, and the purging state in the purge stocker 1 on the display.

Figure 4A:
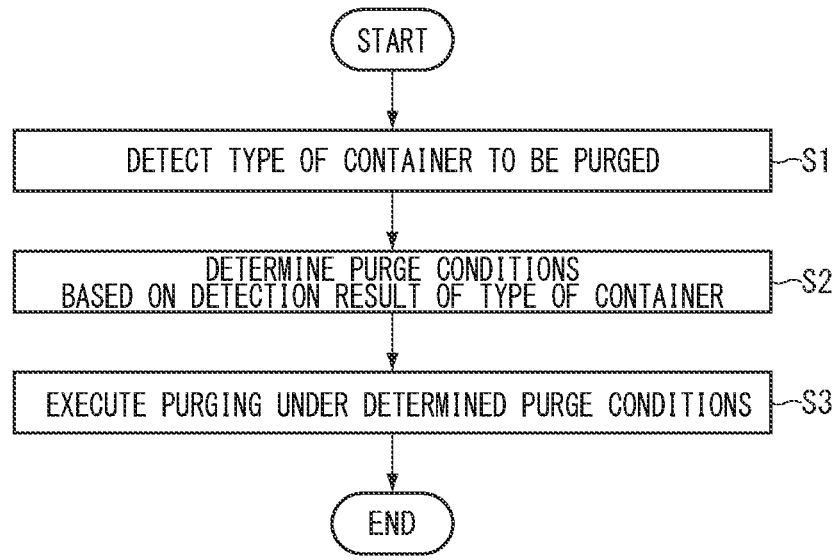
FIGS. 4A and 4B are flowcharts illustrating a purge method according to a preferred embodiment of the present invention.
Figure 4B:
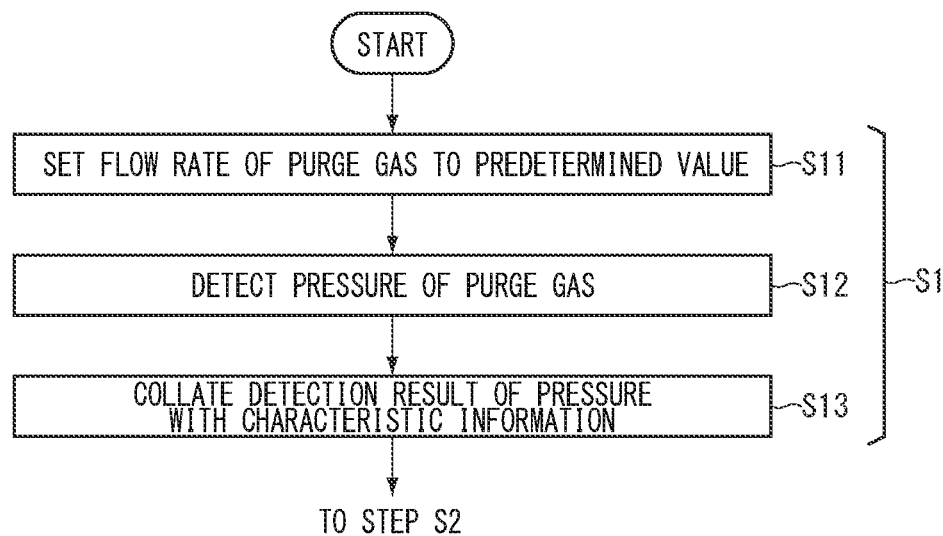

Next, a purge method according to a preferred embodiment of the present invention is described based on the operation of the above-mentioned purge device 4A. FIG. 4A is a flowchart illustrating the purge method according to the present preferred embodiment. FIG. 4B is a flowchart illustrating an example of processing of Step S1 in FIG. 4A. At Step S1, the type detector 41 detects the type of a container F to be purged. As illustrated in FIG. 4B, at Step S11 in Step S1, the purge controller 42 controls the flow rate control device 33 to set the flow rate of a purge gas to a predetermined value. At Step S12, the state detector 34 (manometer 44) detects the pressure (supply pressure) of the purge gas in the state in which the flow rate of the purge gas is set to the predetermined value. At Step S13, the type detector 41 collates the detection result of the pressure with characteristic information D1 to determine the type of the container F. Note that the type detector 41 may detect the type of the container F by other methods, and the other methods are described in second and subsequent preferred embodiments. Returning to the description with reference to FIG. 4A, at Step S2, the purge controller 42 determines a purge condition based on the type of the container F. For example, the purge controller 42 determines purge conditions suited for the type of the container F by collating the type of the container F detected by the type detector with the condition information D2. At Step S3, the purge controller 42 controls the flow rate control device 33 to execute purging under the purge condition determined at Step S2.

Second Preferred Embodiment

Figure 5A:
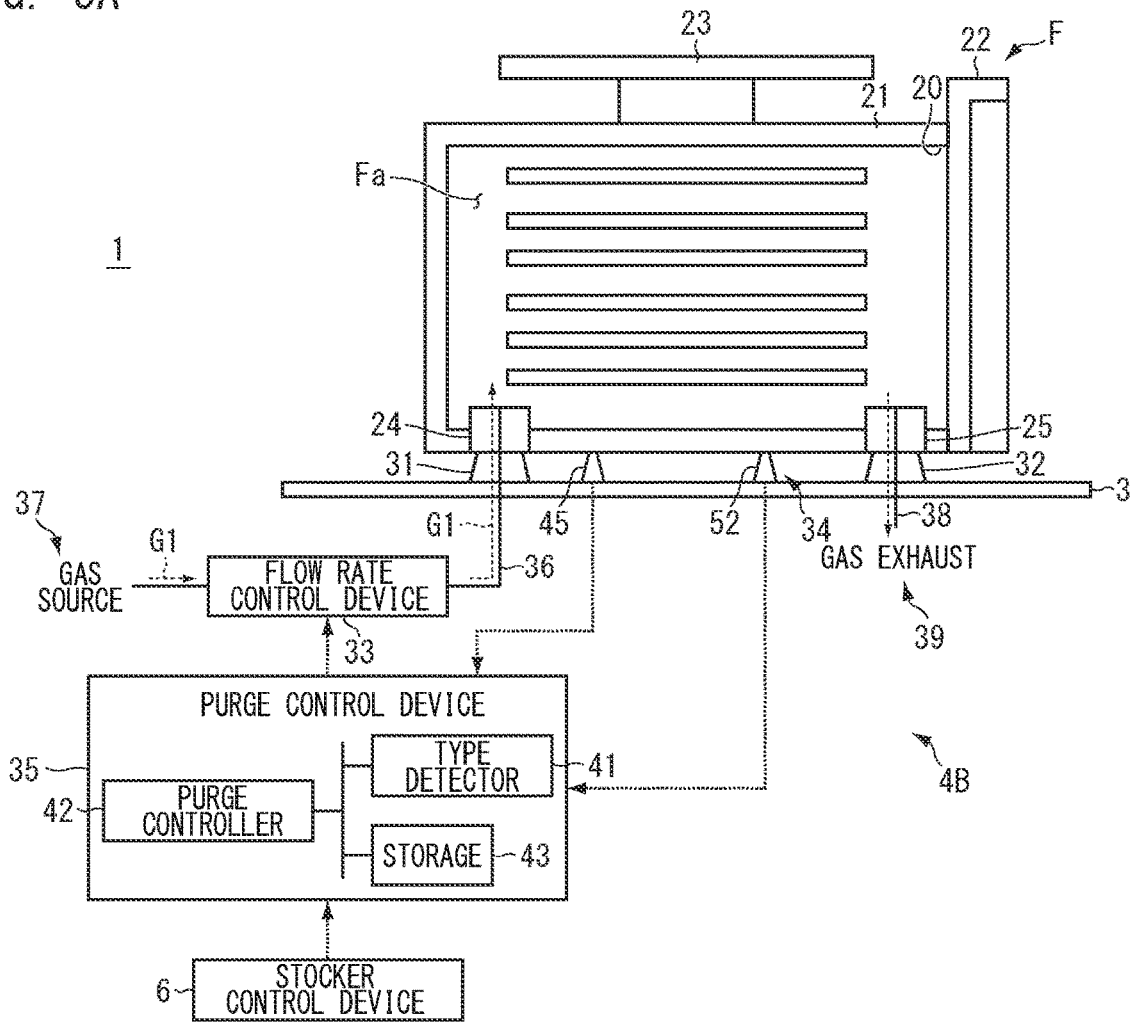
FIGS. 5A and 5B are diagrams illustrating a purge device and an identifier of a container according to a second preferred embodiment of the present invention.
Figure 5B:
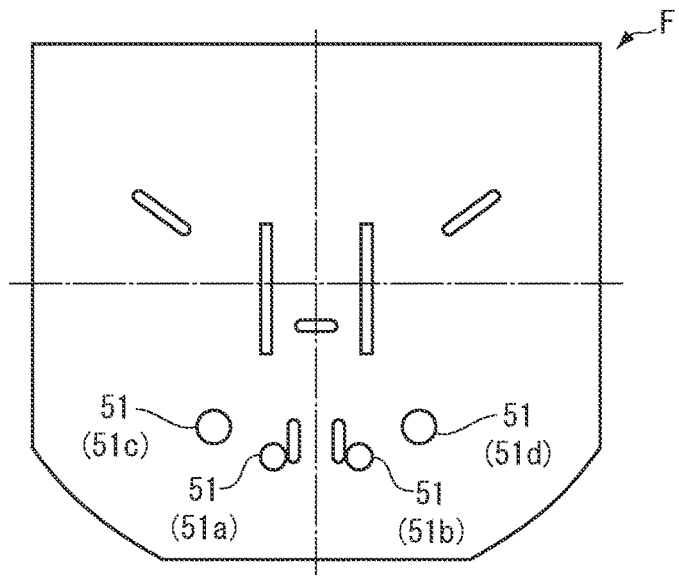

A second preferred embodiment of the present invention is described. In the second preferred embodiment, the same components as in the above-mentioned preferred embodiment are denoted by the same reference symbols as appropriate, and descriptions thereof are omitted and simplified. FIG. 5A is a diagram illustrating a purge device 4B according to the second preferred embodiment, and FIG. 5B is a diagram illustrating an identifier 51 of a container F. The purge device 4B includes a sensor 52 that detects the identifier 51 (see FIG. 5B) provided to the container F. As the identifier 51, at least one of info pads 51a to 51d provided on the bottom surface of the container F is used. The positions of the info pads 51a to 51d are prescribed by a standard, and do not depend on the type of the container. Each of the info pads 51a to 51d represents information on the container F (information such as specifications and data) based on whether a cap is fitted into a recess with a circular opening shape, that is, based on the height of its bottom surface at the planar position of each of the info pads 51a to 51d. The info pad 51a represents a carrier capacity (for example, the containable number of wafers). The info pad 51b represents a carrier type (for example, a cassette or a box). The info pads 51c and 51d alternatively represent whether the carrier is dedicated for a pre-process (FEOL) or for a post-process (BEOL). The pre-process is a process before a process where metal contamination may occur, and the post-process is a process after the process where metal contamination may occur.

The sensor 52 is a contact sensor such as a button sensor, and is disposed on the planar position of each of the info pads 51a to 51d. For example, when a cap is fitted into the recess of the info pad 51a representing the carrier capacity, the sensor 52 is pushed down by the cap. When the cap is not fitted into the recess, the sensor 52 enters the recess and is not pushed down. This enables detection of whether the number of wafers containable in the container F is 13 or 25 based on whether the sensor is pushed down. The sensor 52 is communicably connected to the purge control device 35, and supplies the detection result to the purge control device 35. Note that the sensor 52 may be a contactless sensor, such as an optical sensor and an electrostatic sensor.

In the second preferred embodiment, the type detector 41 discriminates the type of the container F based on the detection result from the sensor 52 that detects the identifier 51 provided to the container F and based on identifier information in which the identifier 51 and the type of the container F are associated with each other. The identifier information is, for example, table data in which the states of the info pads 51a to 51d and the type of the container F are associated with each other. Here, the state in which the cap is fitted into the recess is represented by "1", and the state in which the cap is not fitted into the recess is represented by "0". The states of the info pads 51a to 51d are represented by 4-bit data such as (1,0,0,1) using the above-mentioned "0" and "1". In the identifier information, for example, the states of the info pads 51a to 51d (for example, (1,0,0,1)) and the type of the container F (for example, type A3 in FIG. 3B) are associated with each other. Such identifier information is stored in the storage 43. The type detector 41 acquires the identifier information from the storage 43, and collates the detection result from the sensor 52 (states of info pads 51a to 51d) with the identifier information to discriminate the type of the container F. The purge controller 42 determines purge conditions based on the type of the container F discriminated by the type detector 41. Furthermore, the purge controller 42 controls the flow rate control device 33 to execute the purging under the determined purge conditions.

Third Preferred Embodiment

A third preferred embodiment of the present invention is described. In the third preferred embodiment, the same components as in the above-mentioned preferred embodiments are denoted by the same reference symbols as appropriate, and descriptions thereof are omitted or simplified.

Figure 6:
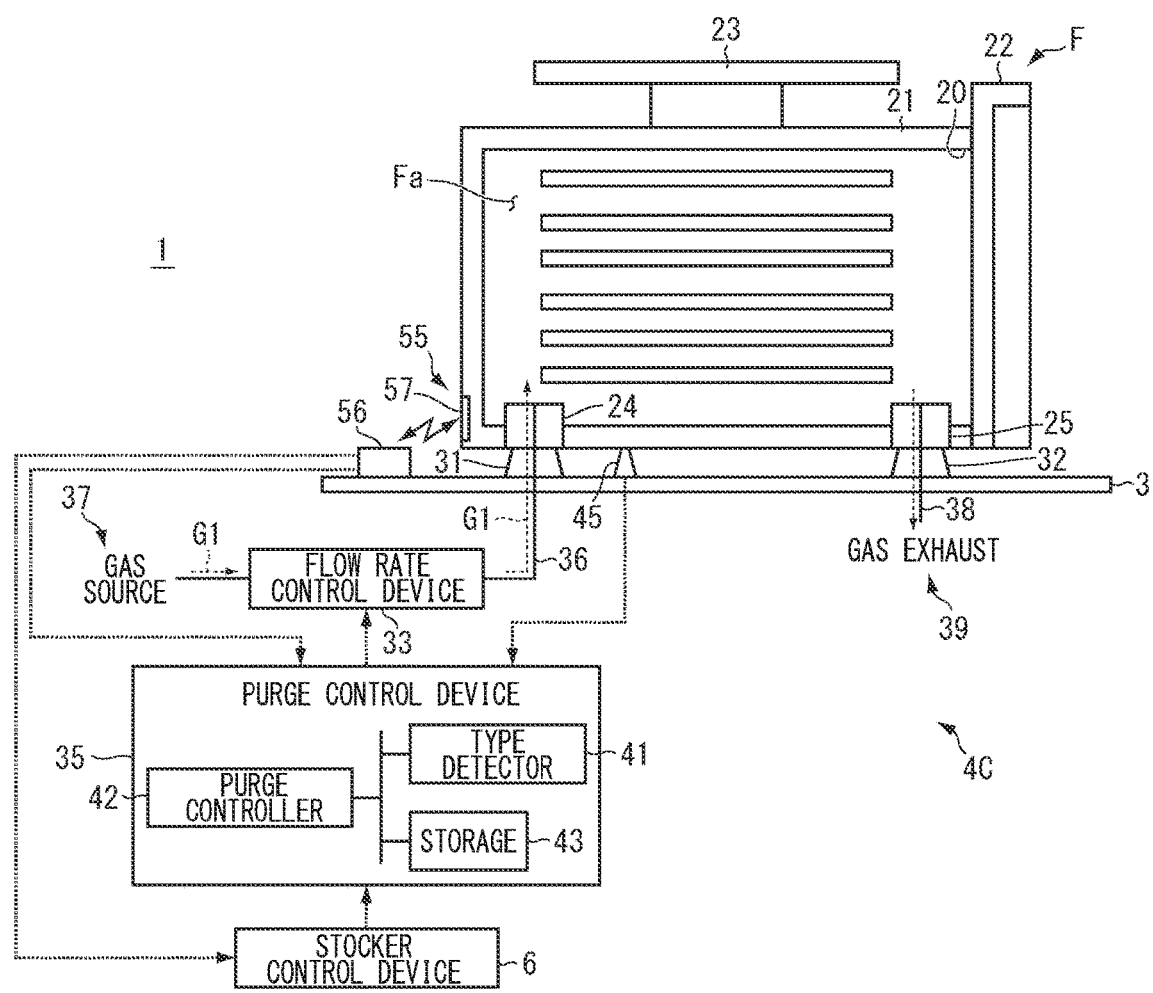
FIG. 6 is a diagram illustrating a purge device according to a third preferred embodiment of the present invention.

FIG. 6 is a diagram illustrating a purge device 4C according to the third preferred embodiment. The purge device 4C includes a sensor 56 that detects an identifier 55 provided to a container F. In the second preferred embodiment, the pads (info pads 51a to 51d) are used as the identifiers 51, whereas a unique code allocated to the container F is used as the identifier 55 in the third preferred embodiment. This code is represented by a predetermined number of numbers, alphabets, symbols, or a combination thereof, such as "015 . . . " and "A27 . . . ", and the codes are allocated so as not to overlap from one container F to another. This code is housed in an identification member 57 provided to the container F, and the sensor 56 acquires the code from the identification member 57. For example, the identification member 57 is an RFID tag, a barcode, or a QR code (trademark), and the sensor 56 is a reader. For example, the sensor 56 is provided at a position that enables the code to be read from the identification member 57 in the state in which the container F and the purge device 4A are connected such that the container F is purgeable. In FIG. 6, the sensor 56 is disposed in the vicinity of the position in the storage shelf 3 at which the container F is purged.

The sensor 56 is communicably connected to the stocker control device 6, and supplies the detection result (code of the identifier 55) to the stocker control device 6. The stocker control device 6 uses the code acquired from the sensor 56 for the management of the container F. For example, the stocker control device 6 manages information on the container F, such as a carry-in source, a carry-in destination, and contained matters, based on the code. Furthermore, the sensor 56 is communicably connected to the purge control device 35, and supplies the detection result (code of the identifier 55) to the purge control device 35. The type detector 41 detects the type of the container F based on the acquired code. For example, the code of the container F is set in advance such that a predetermined digit of numbers, characters, and symbols represents the type of the container F in a manner that when the beginning of the code is "0", the type of the container F is A3 (see FIG. 3B), and when the beginning of the code is "A", the type of the container F is A4. The type detector 41 discriminates the type of the container F based on any one of a predetermined digit of numbers, characters, and symbols, or a combination thereof. The purge controller 42 determines purge conditions based on the type of the container F discriminated by the type detector 41. Furthermore, the purge controller 42 controls the flow rate control device 33 to execute the purging under the determined purge conditions. Note that the sensor 56 is not necessarily required to be connected to the stocker control device 6, and is not necessarily required to supply the detection result to the stocker control device 6.

Fourth Preferred Embodiment

Figure 7:
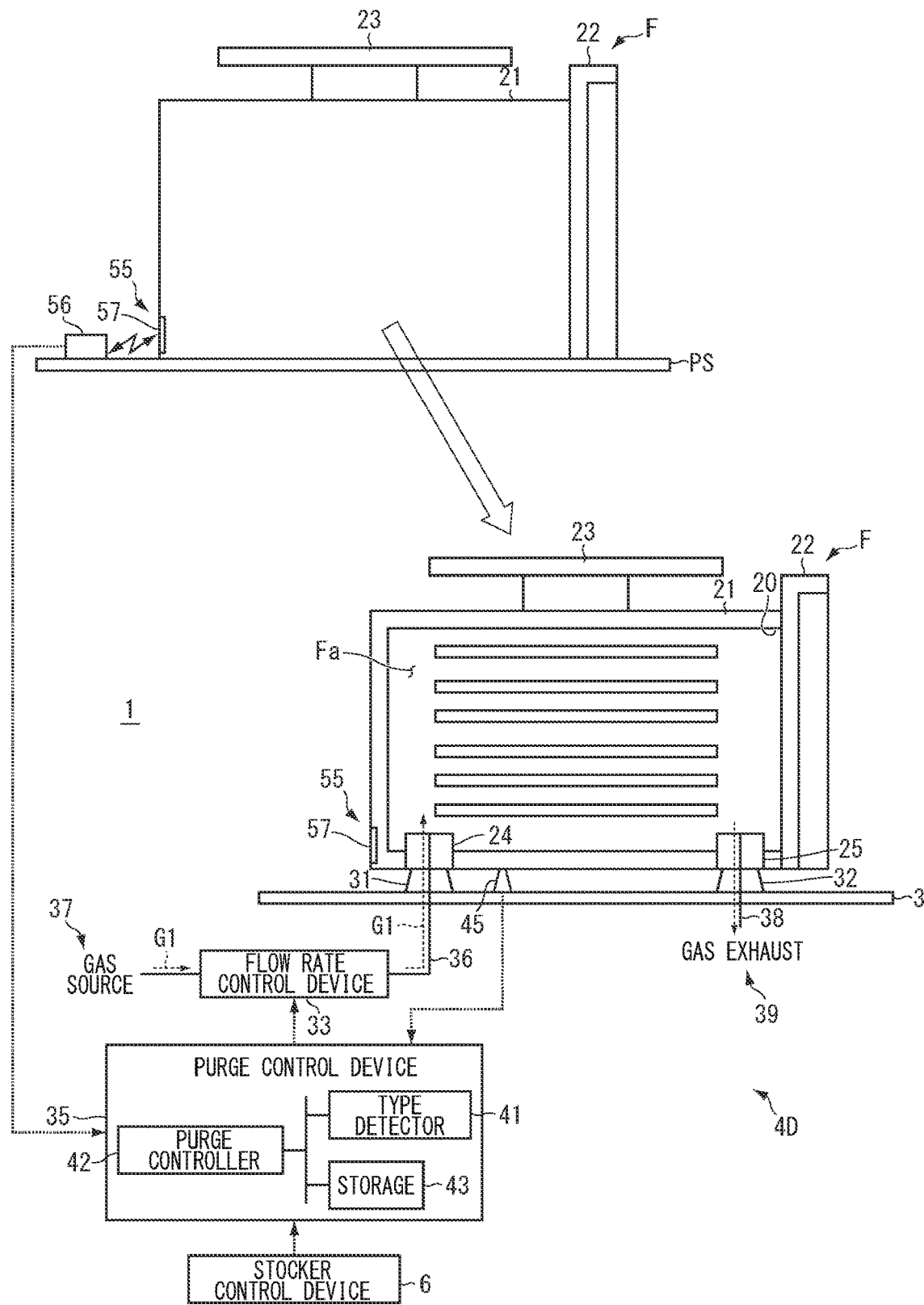
FIG. 7 is a diagram illustrating a purge device according to a fourth preferred embodiment of the present invention.

A fourth preferred embodiment of the present invention is described. In the fourth preferred embodiment, the same components as in the above-mentioned preferred embodiments are denoted by the same reference symbols as appropriate, and descriptions thereof are omitted or simplified. FIG. 7 is a diagram illustrating a purge device 4D according to the fourth preferred embodiment. In the third preferred embodiment, the sensor 56 is provided to the storage shelf 3, whereas the sensor 56 is provided to a place different from the storage shelf 3 in the fourth preferred embodiment. In FIG. 7, the sensor 56 is disposed at a placement site PS on which a container F is placeable. The placement site PS may be any of a loading and unloading port for the purge stocker 1, a temporary storage for a ceiling conveyance device (for example, overhead buffer (OHB), side track storage (STS), and under track storage (UTS)), a temporary storage for a processing device that processes (uses) contained matters in containers F (tool buffer), and a changer that switches contained matters in containers F. The sensor 56 is communicably connected to the purge control device 35, and supplies the detection result (code of the identifier 55) to the purge control device 35. The type detector 41 detects the type of the container F based on the acquired code. The purge controller 42 determines purge conditions based on the type of the container F discriminated by the type detector 41. Furthermore, the purge controller 42 controls the flow rate control device 33 under the determined purge conditions to execute purging.

Note that the sensor 56 may be installed at any position in a conveyance path for the container F, and instead of reading a code from the identifier 55 of the container F placed at the placement site PS, the sensor 56 may read the code from the identifier 55 of the container F that is being conveyed. Furthermore, the number of sensors 56 is freely selectable, and a plurality of sensors 56 may be provided in the conveyance path. The sensor 56 may be included in the purge device 4A or may be included in another device (for example, the stocker control device 6 or the conveyance device) than the purge device 4A. Furthermore, the sensor 56 may be connected to the stocker control device 6 to supply the detection result to the stocker control device 6 as in the third preferred embodiment. Furthermore, the configuration in which the identifier is used as in the fourth preferred embodiment and the configuration in which the detected purge characteristics are used as in the first preferred embodiment may be used in combination.

In the above-mentioned preferred embodiments, the purge control device 35 includes, for example, a computer system that is configured or programmed to define or include the type detector 41, the purge controller 42, and the storage 43. The purge control device 35 reads a computer program stored in the storage 43, and executes various kinds of processing in accordance with the computer program. For example, the computer program causes a computer to execute: detecting the type of a container F to be purged; and determining purge conditions for the container F based on a result of the detection. The computer program may be provided in a state of being recorded in a computer readable storage medium. As far as permitted by the applicable law, the contents of Japanese Patent Application No. 2015-165521 and all the documents cited in the above-mentioned preferred embodiments are incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:
1. A purge device, comprising:
a type detector that detects a type of a container to be purged;
a purge controller that determines purge conditions for the container based on a detection result from the type detector;
a state detector that detects a purged state of the container; and
a flow rate controller that controls a flow rate of a purge gas in a pipe connected to the container, wherein the type detector detects the type of the container based on a detection result from the state detector;

the state detector detects a pressure of the purge gas in the pipe as the purged state; and the type detector detects the type of the container based on purge characteristics of the container acquired based on the pressure detected by the state detector.

2. The purge device according to claim 1, wherein the type detector discriminates the type of the container based on characteristic information in which the pressure and the type of the container are associated with each other and based on a detection result from the state detector.

3. The purge device according to claim 1, wherein the type detector discriminates the type of the container based on a detection result from a sensor that detects an identifier provided to the container and based on identifier information in which the identifier and the type of the container are associated with each other.

4. The purge device according to claim 3, wherein a unique code allocated to the container is used as the identifier.

5. The purge device according to claim 3, wherein an info pad provided on a bottom surface of the container is used as the identifier.

6. The purge device according to claim 1, further comprising a flow rate controller that controls a flow rate of a purge gas supplied to the container; wherein the purge controller determines the purge conditions based on condition information in which the type of the container and the purge conditions are associated with each other, and controls the flow rate control device based on the determined purge conditions.

7. The purge device according to claim 1, wherein the purge conditions include a flow rate and a supply time of a purge gas supplied to the container.

8. A purge stocker, comprising:
the purge device including:
 a type detector that detects a type of a container to be purged;
 a purge controller that determines purge conditions for the container based on a detection result from the type detector;
 a state detector that detects a purged state of the container; and
 a flow rate controller that controls a flow rate of a purge gas in a pipe connected to the container;
a shelf that holds the container purged by the purge device, wherein
the type detector detects the type of the container based on a detection result from the state detector;
the state detector detects a pressure of the purge gas in the pipe as the purged state; and
the type detector detects the type of the container based on purge characteristics of the container acquired based on the pressure detected by the state detector.

9. A purge method, comprising:
detecting a type of a container to be purged;
determining purge conditions for the container based on a result of the detection of the type of the container;
detecting a purged state of the container; and
controlling flow rate of purge gas in a pipe connected to the container, wherein
the type of the container is detected based on the detected purged state of the container;
detecting the purged state of the container includes detecting a pressure of the purge gas in the pipe as the purged state; and
the type of the container is detected based on purge characteristics of the container acquired based on the detected pressure.

* * * * *